United States Patent [19]
Hasegawa et al.

[11] Patent Number: 5,551,626
[45] Date of Patent: Sep. 3, 1996

[54] DIFFUSION JOINING METHOD AND A PASTE USED THEREFOR

[75] Inventors: Yo Hasegawa, Nara; Masahiro Nagasawa, Hirakata; Masahide Tsukamoto, Nara, all of Japan

[73] Assignee: Matsushita Electric Industrial Co., Ltd., Kadoma, Japan

[21] Appl. No.: 394,482

[22] Filed: Feb. 27, 1995

Related U.S. Application Data

[62] Division of Ser. No. 71,400, Jun. 4, 1993, Pat. No. 5,439,164.

[30] Foreign Application Priority Data

Jun. 5, 1992 [JP] Japan ................... 4-145276
Sep. 8, 1992 [JP] Japan ................... 4-239064
Dec. 1, 1993 [JP] Japan ................... 5-003127

[51] Int. Cl.⁶ .................................................. H05K 3/34
[52] U.S. Cl. ............................. 228/179.1; 228/248.1
[58] Field of Search ........................... 228/193, 194, 228/179.1, 208, 224, 248.1, 262.6; 29/830, 852; 361/792

[56] References Cited

U.S. PATENT DOCUMENTS

| | | | |
|---|---|---|---|
| 4,228,944 | 10/1980 | Inamura et al. | 228/198 |
| 4,383,363 | 5/1983 | Hayakawa et al. | 29/847 |
| 4,569,876 | 2/1986 | Nakakita | 428/131 |
| 4,719,134 | 1/1988 | Ely | 228/180.1 |
| 4,768,787 | 9/1988 | Shira | 273/175 |

FOREIGN PATENT DOCUMENTS

| | | |
|---|---|---|
| 0138672 | 4/1985 | European Pat. Off. . |
| 1213876 | 4/1960 | France . |
| 4-146972 | 5/1992 | Japan . |

OTHER PUBLICATIONS

Low–Temperature Solid–State Bonding of Copper, Journal of Materials Engineering and Performance, No. 1, Feb. 1, 1992, pp. 35–44.

*Primary Examiner*—Samuel M. Heinrich
*Attorney, Agent, or Firm*—McDermott, Will & Emery

[57] ABSTRACT

The present invention relates to a diffusion joining method of Cu or Cu alloy surface and a conductive paste used therefor, especially applied to a method for preparing a multilayer printed wiring board. The present invention is characterized by providing the contacting surfaces with a layer selected from the group comprising a noble metal thin layer, a metal oxide remover layer and a conductive paste layer mainly consisting of a Cu or Cu alloy particles and the metal oxide remover; and pressing the contacting metal surfaces at a temperature higher than 170° C. more or less whereat the Cu atom at interface of the Cu or Cu alloy surfaces to be joined becomes to be able to diffuse, to give a joined metal body.

5 Claims, 7 Drawing Sheets

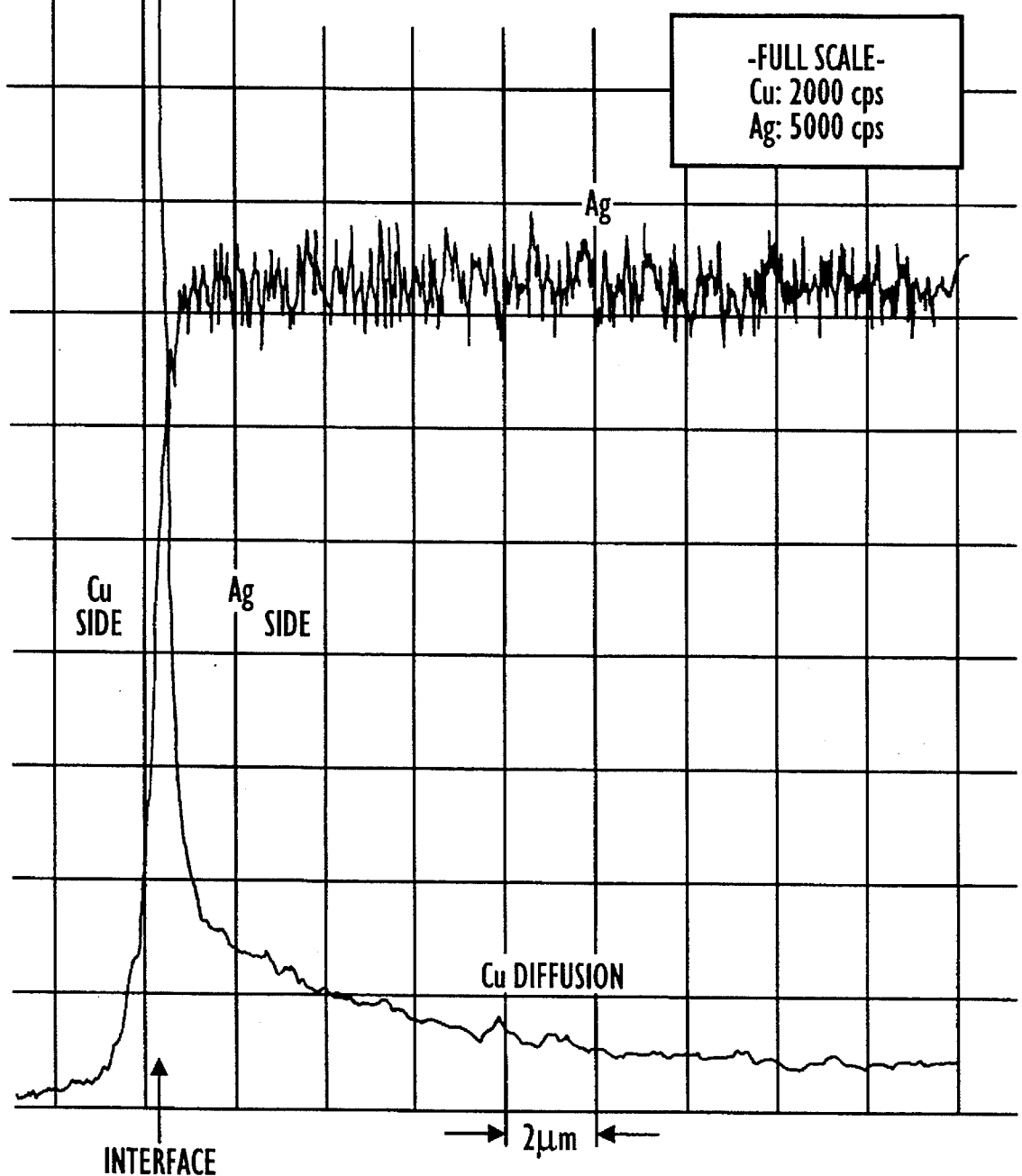

Cu DIFFUSION OF DEOXIDIZED Cu / SILVER
INTERFACE (180°c, 30 MIN, PRESSED)

DIFFUSION JOINING METHOD AND A PASTE USED THEREFOR

This is a divisional of application Ser. No. 08/071,400, filed Jun. 4, 1993, now U.S. Pat. No. 5,439,164.

BACKGROUND OF THE INVENTION

1. Field of the Invention

The present invention relates to a new diffusion joining method used for joining Cu or Cu alloy contacting surfaces at a low temperature in the field of metallurgical technology and electronic engineering, which may be applied particularly to a method for preparing a multilayer printed wiring board and also relates to a paste used in the method.

2. Description of the Prior Art

Hitherto, in order to join at least two contacting metal surfaces there has been used widely a joining method, such as soldering. In the electronic engineering, there has been sometimes used an ultrasonic joining method, but in general the reliability of electric connection could not be obtained by any other method than the soldering method.

However, in the soldering method a contacting metal component such as lead or tin different from copper of the surfaces to be connected sometimes causes generation of corrosion in the joint and also causes formation of intermetallic compound, which causes the problems of a faulty joint in which cracks easily generate by repeating stress. The aforementioned ultrasonic joining method does not produce the above problems, but causes the problem of only a small connecting area which can not be applied to the usual metal joint.

Therefore, a first object, of the present invention is to provide a new method for joining the contacting of Cu or Cu alloy surfaces which is superior in the joint reliability.

Further, many kinds of resin dispersive type conductive pastes have been used for connection of electronic parts or circuits and formation of electroconductive paths. However, this causes a problem of the joint having a relatively high resistance and thus tends to indicate non-ohmic characteristic by which the resistance increases in a low current range, so that use of the conventional conductive paste is limited.

Therefore, a second object of the present invention is to provide a new conductive paste which can brings the above joining method into practice.

On the other hand, the methods used for connecting via holes of a multilayer printed wiring board in the electronic circuits are classified into two groups. One is a method for forming a conductive path in the via hole by means of electroplating, the other being a method for filling the via holes with the conductive paste which is referred to an Ag through hole method.

However, the electroplating method can provide the via hole which is superior in conductivity and reliability while it requires many processes and facilities for electroplating or washing drainage of by-products of the process, which disadvantageously is costly. The other method can provide an easy-making and inexpensive Ag through hole while it has a relatively high resistance and thus tends to indicate non-ohmic characteristic by which the resistance increases in a low current range, so that use of the conventional conductive paste is limited.

Therefore, a third object of the present invention is to provide a method for preparing a multilayer printed wiring board at a low cost and having a low resistance and a high reliability.

SUMMARY OF THE INVENTION

As a result of our researches, we surprisingly found that Cu atoms at the contacting interface begin to diffuse from one contacting surface into the other contacting-surface in an air atmosphere even at a temperature of about 170° C. if a metal oxide layer is not formed at the contacting surfaces.

According to the first aspect of the present invention, therefore, on the basis of the inventive acknowledgement, there is provided a method for joining at least two contacting Cu or Cu alloy surfaces at a lower temperature by diffusing Cu atoms into an opposite metal surface from the Cu or Cu alloy surface, which comprises:

providing the Cu or Cu alloy surface with a layer selected from the group comprising a noble metal thin film, a coating of metal oxide remover and a coating of a conductive paste consisting of a Cu or Cu alloy particles and the metal oxide remover; and pressing the contacting metal surfaces at a temperature higher than about 170° C. whereat the Cu atoms at interface of the Cu or Cu alloy surfaces to be joined can be diffused, to give a joined metal body.

In an embodiment according to the present invention, it is preferable that one of the contacting metal surfaces is Cu or Cu alloy and coated with a coating layer of the metal oxide remover, while the other surface is of noble metal or alloy thereof or of any other metal provided with the thin layer of noble metal or alloy thereof by means of electroplating, evaporating or sputtering.

In the present invention, the metal oxide remover is preferably selected from the group comprising carboxylic acids and polymers or oligomers having carboxyl groups.

Further, according to a second aspect of the present invention, there is provided an electroconductive paste used for joining contacting metal surfaces at a lower temperature by diffusing Cu atoms into an opposite metal surface from the Cu or Cu alloy surface, which comprises metal particles selected from the group comprising noble metal, Cu and alloy thereof, a metal oxide remover and if necessary a binding resin.

In an embodiment of the electroconductive paste, any surface active agent available in the soldering technology may be used as the metal oxide remover and it is preferable that it is selected from the group comprising carboxylic acids and polymers or oligomers having carboxyl groups. It is more preferable that the metal oxide remover acts as the binding resin. The Cu or Cu alloy particles are preferably of spherical form since Cu atoms diffusion is easy to occur.

Furthermore, according to the third aspect of the present invention, the diffusion joining method is applied to a method for preparing a multilayer printed wiring board. The method comprises: a step of providing at least two foils of Cu or Cu alloy; a step of interposing each insulating adhesive layer between each pair of the foils; a step of making via holes at desired positions of the each insulating adhesive layer; a step of imprinting the via holes with a conductive paste and a step of heat-pressing them to electrically connect the foils through the via holes imprinted with the conductive paste, and is characterized in that the conductive paste mainly consists of conductive metal particles selected from the group comprising Ag, Cu and alloys thereof and a metal oxide remover while the heat pressing is carried out at a temperature higher than about 170° C. whereat the Cu atom can be diffused.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which:

FIG. 5 a graph of Cu diffusion of silver electroplated Cu/Silver interface (180° C., 30 min, Pressed) at XMA analysis in Example 5;

DESCRIPTION OF THE PREFERRED EMBODIMENTS

Figure 1A:
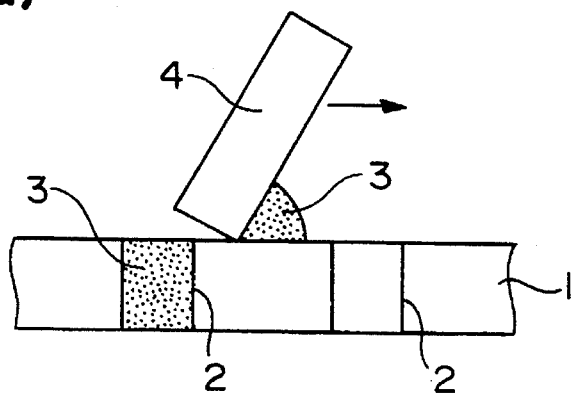
FIG. 1 is a schematic view showing a joining process for preparing a double-layer printed wiring board according to the prurient invention.

The joining method of the present invention can be applied to contacting metal surfaces of Cu or Cu alloy such as an electric copper, a rolled copper, bronze, brass, beryllium copper, gun metal. The metal parts to be joined may be of any form such as a plate, a foil, a wire, a rod and so on, but it is necessary that the surfaces to be joined are subjected to a coating treatment with the metal oxide remover or noble metal before joining.

In the case of noble metal plating, there are known many kinds of pretreatment for removing oxide layer before plating, which are an acid etching method, an mechanical grinding method and heating method in a reducing atmosphere, from which a suitable method may be optionally selected depending on factors such as the shapes to be joined and the required characteristics. For example, in the case of a continuous film such as a copper foil, a wet continuous process may be applied, while in the case of small parts such as one body elements, a reducing oven may be used.

Following the oxide layer removing treatment, a thin noble metal layer (or plating) is deposited. The noble metal layer prevents the surface from oxidizing. Otherwise, the metal oxide formed in the following heating process may prevent Cu atoms from diffusing during the joining process. Contrary to this invention, the conventional Ni plating for preventing the surface from oxidizing, prevents Cu atoms from diffusing. Therefore, the noble plating on the clean Cu or Cu alloy surface is essential to make Cu atoms diffuse. Even a small thickness of the noble metal plating is sufficient to prevent the contacting surface from oxidizing and promote diffusion of Cu atoms from one contacting surface into the opposite contacting surface. As described below, a noble metal layer of 100 Å thickness is sufficient for that purpose. The noble metal layer of noble metal large of a larger thickness does not prevent the contacting surfaces from joining by the Cu atom diffusion, but it disadvantageously is high in cost. Further, in the case of using silver as the noble metal, silver thick layer causes silver migration, which results in lowering of reliability of the joint.

The noble metal plating method, used is any of the known methods, such as electroplating, chemical plating, vacuum deposition, sputtering. A suitable method can be optionally selected according to the shape to be joined. The noble metal includes gold, silver, platinum, palladium and rhodium. Considering the cost, gold and silver are suitable. In the case of silver, there sometimes occurs color change of the plating surface by sulfidization, but such a change does not adversely affect the joint.

In place of the noble metal plating, a metal oxide remover may be coated on the surface of Cu or Cu alloy when joining the surfaces. The metal oxide remover means an active agent which reacts with Cu oxide and makes the Cu or Cu alloy's surface into a pure metal surface. Especially carboxylic acid and polymers or oligomers containing carboxyl groups are preferred. Examples of carboxylic acid includes linear or side chain type saturated fatty acid such as caproic acid, enanthic acid, caprylic acid, 2-ethylhexanoic acid, stearic acid and similar acids; unsaturated fatty acid such as oleic acid, linoleic acids, linolenic acids and so on; mono- or multi-basic carboxylic acid or amino carboxylic acid such as abietic acid, succinic acid, malonic acid, aspartic acid and similar acids; esters thereof. Examples of the polymers or oligomers include polymers or copolymers of acrylic acid, copolymers of maleic acid, alkyd resin, polybutadiene having terminated or pendant carboxyl groups and similar polymers or copolymer.

The remover is coated directly or in a solution to Cu or Cu alloy surfaces. The other examples include a conventional active agent used as flux in the soldering such as hydrochloric acid, formic acid, acetic acid, lactic acid, primary, secondary and tertiary amines and their salts such as dimethylamine hydrochloride. In the case of using inorganic active agent, cleaning for removing the agent is necessary after the joining process.

While even thick oxide layer can be removed by solution action of the remover, it is preferred in such a case that the oxide layer has already been removed before coating in a similar way to the electroplating case.

The temperature required for joining the Cu or Cu alloy surface is more than about 170° C. When it is lower than that temperature, Cu atoms can not diffuse to the opposite surface, resulting in no bonding between the contacting surfaces. On the other hand, while there is not present an upper limit of the temperature, the joining process is preferably carried out at as a low temperature as possible since Cu or Cu alloy is easily oxidized. Higher temperature in the practicable range causes prompt joining. If possible, an ultrasonic method may be applied at the same time of the heat-pressing process.

The pressing for the contacting surfaces does not require an extreme high pressure other than that needed to make the opposite surfaces join be contacted to each other. It is preferred that the roughness at the contacting surface is as small as possible in order to lower the pressure needed for such a joining. Even if the contacting surface has a bad roughness, Cu or Cu alloy can be deformed to be able to be joined because of its low rigidity. Further, insertion of a ductile metal, such as gold or silver, between the Cu or Cu alloy contacting surfaces causes the contacting area to be increased and the joint strength to be improved even by means of the lower pressing pressure.

The joining method according to the present invention may be applied not only to plates or boards but also to powders or particles. Therefore, the same joining and method can be applied to a joint or connection formed by a conductive paste. That is, the conductive paste used for joining contacting metal surfaces at a lower temperature can be prepared by using the metal oxide remover as a binding resin of the conductive paste or adding the metal oxide remover to the binding resin together with Cu or Cu alloy particles. With use of the conductive paste, the conductive paths can be formed by coating the paste on a substrate or by filling the via holes and heating it under the pressure and indicates ohmic characteristics whereby the resistance never increases even in a lower current range.

The conductive paste according to the present invention is characterized in that it mainly consists of Cu or Cu alloy particles is the electroconductive component and the metal oxide remover for removing the surface oxide layer. As the other component, if necessary, many kinds of binding resins and additives may be added in order to improve printing properties of the paste.

The particles may be preferably of spherical form in order to facilitate the application of local pressure on the contacting surface of the particles, but it is not necessary to have a true sphere because the shape acts only to realize the local contacting state.

Examples of the metal oxide remover acting as the binding resin include polymers or oligomers having carboxyl groups.

Examples of the binding resin also include a thermoplastic resin and thermosetting resin used in the conventional conductive paste such as acrylic resin, epoxy resin, phenolic resin and so on.

The polymer or oligomer having carboxyl groups may be used together with the binding resin, in which if it is epoxy resin, the polymer or oligomer acts as a hardening agent because it has carboxyl groups.

The conductive paste may be used as an assisting agent for joining Cu or Cu alloy surface as well as use a joint for the electric purpose. Especially, if the contacting surface has a bad roughness, the paste also acts to make the surface flat.

The joining method of copper and copper alloy according to the present invention can be used for the manufacture of a multilayer printed wiring board. The following description will be directed to the manufacture of the multilayer printed wiring board with reference to the accompanying drawings.

Figure 1B:
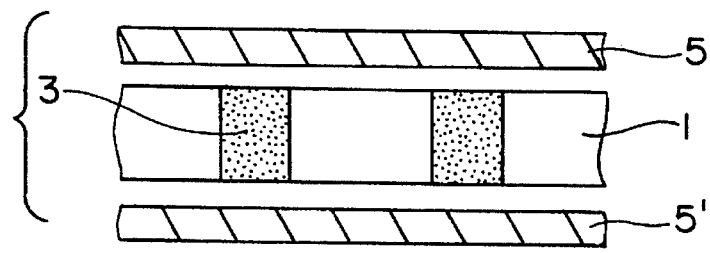
Figure 1C:
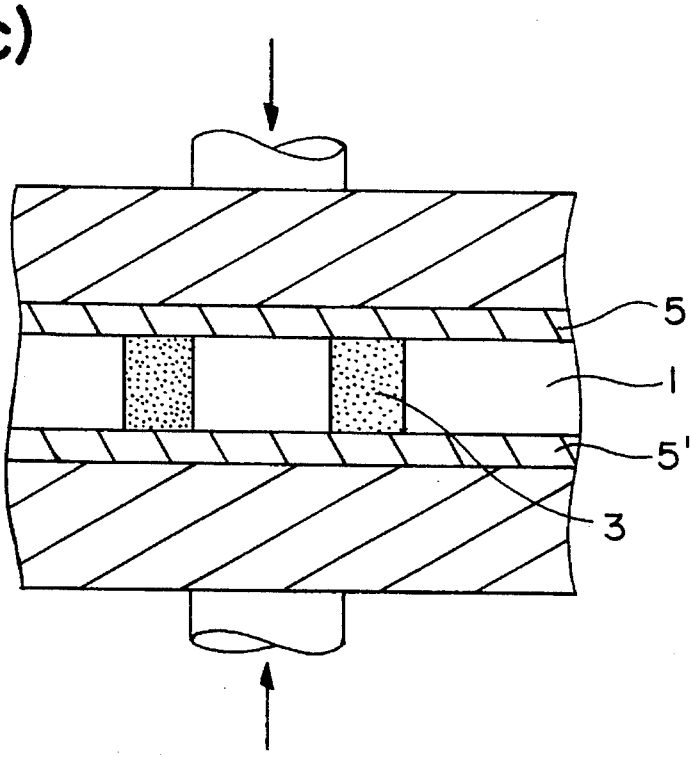
Figure 2A:
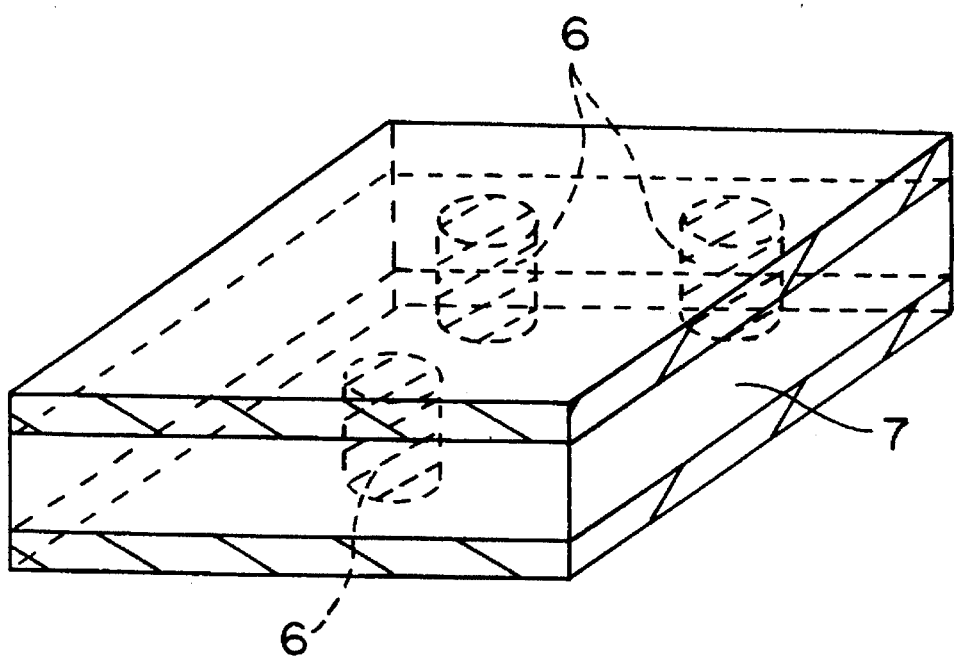
FIG. 2(a) is a perspective view of the double-layer printed wiring board prepared by the process shown in FIG. 1.
Figure 2B:
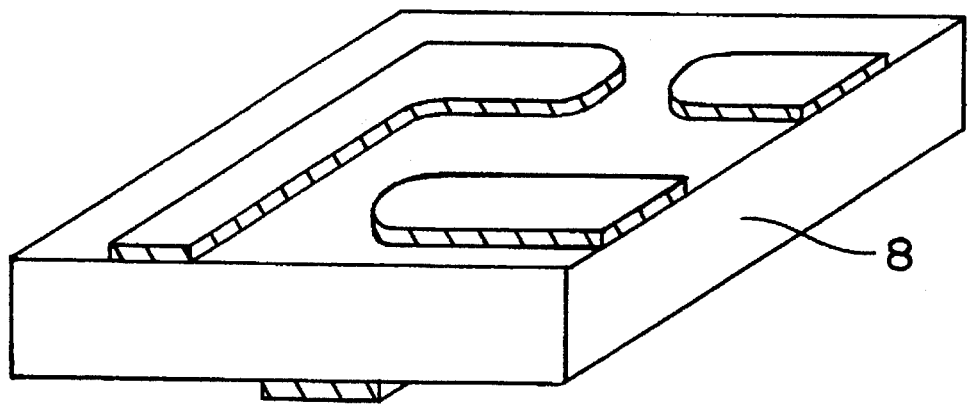
FIG. 2(b) is a perspective view of the board after etching.
Figure 3A:
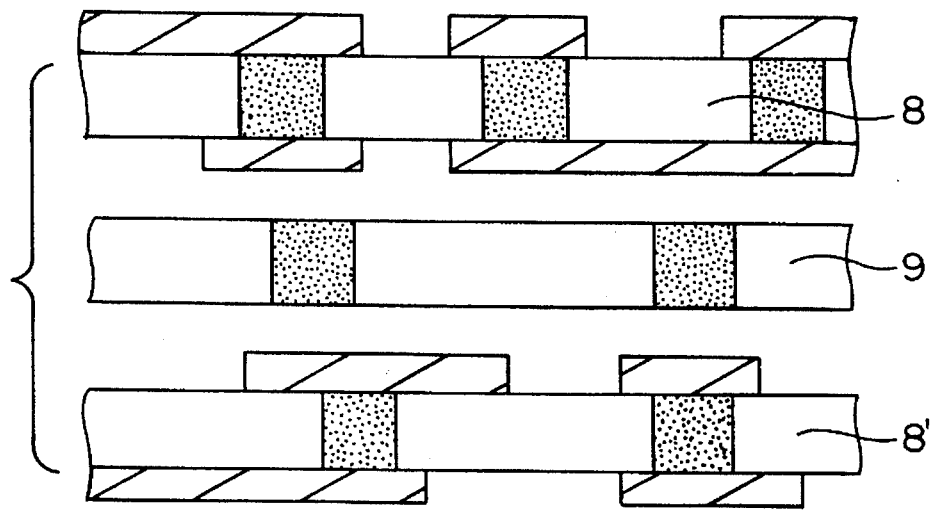
FIG. 3(a) is a schematic view showing a joining process for preparing a four layered printed wiring board from the double layered printed board shown in FIG. 2(b)
Figure 3B:
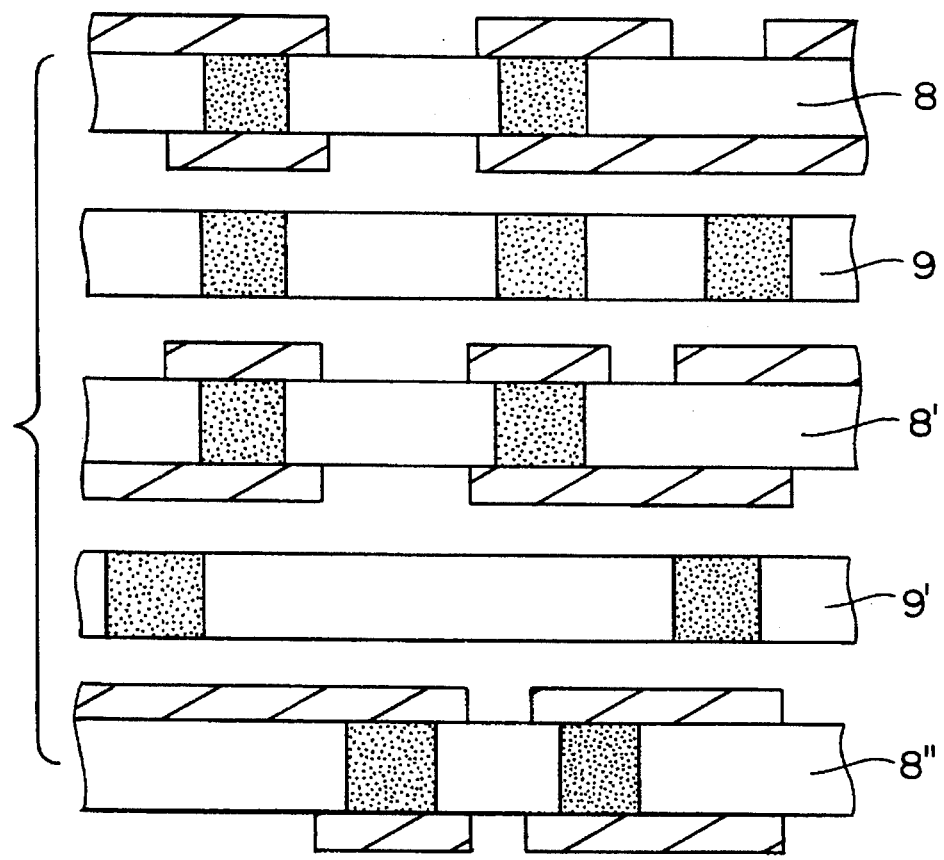
FIG. 3(b) is a schematic view showing a joining process for preparing a six layered printed wiring board from the double layered printed board shown in FIG. 2(b)

Referring to FIG. 1 (*a*), the electric conductive paste 3 mentioned above is imprinted on a hole formed at a given position of the electric insulating adhesive 1 by using, for example, a squeegee 4. The electric insulating adhesive 1 is interposed between two copper foils 5 and 5' and then is pressed at a temperature higher than 170° C. as shown in FIG. 1 (*c*). In such a way, it is possible to form a substrate which has copper foils applied to both sides thereof and which has many via holes formed at necessary positions as shown in FIG. 2 (*a*). The substrate which has copper foils applied to both sides thereof is etched at unnecessary parts with a usual etching method and is formed into a substrate having circuits formed at the both sides thereof as shown in FIG. 2 (*b*). The electric conductive particles in the via hole or holes 6 are joined by a metallic bond as shown above and have a low electrical resistance. Further, the electric conductive particles in the via hole are joined to the copper films through a metallic bond. Therefore, it is possible to obtain a double layered printed wiring board which is superior in the reliability. The double layered printed wiring board according to the present invention can be manufactured in a simple manner similarly to that of a silver through hole printed wiring board. In addition, the via holes are formed by using a metallic bond. Therefore, the via hole according to the present invention has a low electric resistance similarly to that of the via hole formed by an electric plating method and further, has a low electric resistance at a low current range, thereby permitting a wide use for any circuit. Plural double layered printed wiring boards 8, 8' and 8" are combined with plural electric insulating adhesives 9 and 9' having electric conductive paste imprinted at the necessary parts thereto and then pressed together at a temperature higher than 170° C. to form a multilayer printed wiring board having four layers or six layers. A multilayer printed wiring board having more layers can be formed by increasing the number of the double layered printed wiring boards and the insulating adhesives.

The electric conductive paste used in the manufacture of the multilayer printed wiring board according to the present invention is characterized in that it essentially consists of electric conductive particles, such as noble metals or copper and their alloys, and a metal oxide remover. In addition to these components, the electric conductive paste is incorporated with a binder resin and other necessary additives for improving the printing ability. It is necessary for manufacture of the multilayer printed wiring board that the electric conductive paste including a solvent should be dried sufficiently because the paste may be sealed in the board.

In connection with the manufacture of the multilayer printed wiring board according to the present invention, it is preferable that the electric conductive particles are of a spherical form which permits the contact point between conductive particles to be pressed predominantly. In view of the purpose to execute the predominant pressure at the contact point between the electric conductive particles, the spherical form does not necessarily designate a perfectly sphere.

As mentioned above, carboxylic acids or polymers or oligomers including carboxyl group can be used for the metal oxide remover for use in the manufacture of the multilayer printed wiring board according to the present invention. Since the electric conductive paste is closed air-tightly in the substrate during manufacturing of the multilayer printed wiring board according to the present invention, it is necessary to pay attention to the boiling point of the added remover. When the metal oxide remover having a low boiling point remains in the board, the vapor of the metal oxide remover destroys the conductive path in the via hole during the soldering step. Therefore, it is preferable that the metal oxide remover such as fatty acid having a low molecular weight is reacted with a resin to form a stable compound through a chemical reaction, such as epoxy resin and so on.

Figure 4A:
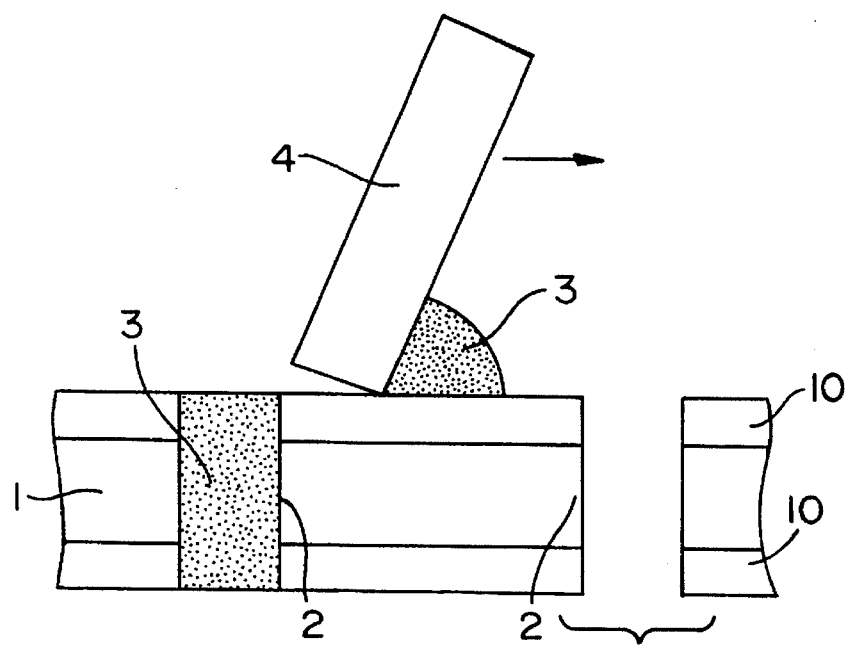
FIG. 4 is a schematic view showing a imprinting process with use of peelable films.
Figure 4B:
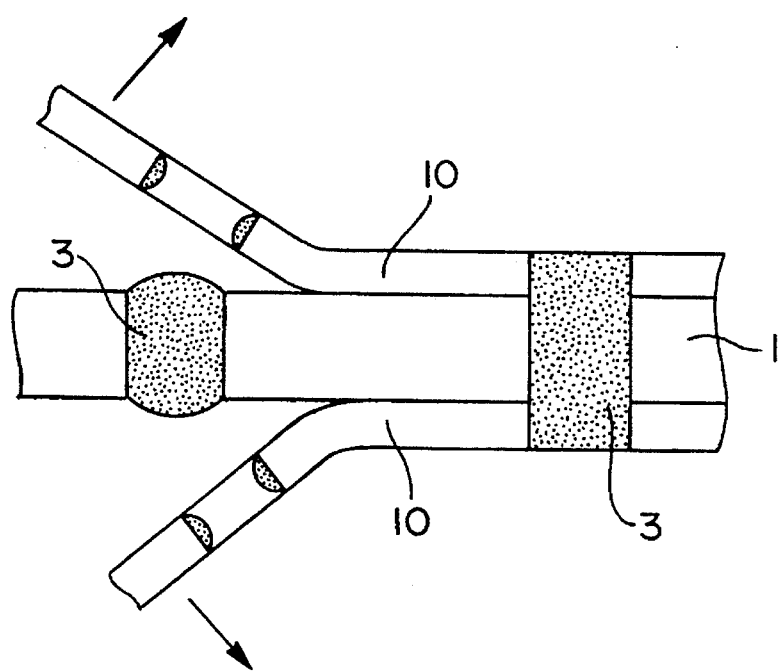

There have been known various imprinting methods such as a screen printing method or a pin method for imprinting the electric conductive paste mentioned above into the hole formed at a given position of the insulating adhesive. FIG. 4 shows another method to use a peelable film 10. The peelable film 10 is applied to the insulating adhesive 1 and then is drilled together with the insulating adhesive 1. The electric conductive paste 3 is imprinted on the peelable film 10, and then the peelable film 10 is peeled off. This method prevents the unnecessary portion of the adhesive from being contaminated with the electric conductive paste. When the electric conductive paste consists of copper or its alloy, it is possible to etch off the electric conductive paste adhered to unnecessary portion other than the via hole.

The pressing process can be carried out at a temperature higher than 170° C., preferably higher than 180° C. When the pressing process is carried out at a temperature lower than 170° C., the lower temperature does not promote the metal atom diffusion process between the metal particles of the electric conductive paste. As a result, even if the via hole has a low electric resistance at initial period, it shows the break down or an increase in the electrical resistivity during the reliability test.

The necessary pressing pressure varies with the kind of the metal particles used. The lower pressure is allowable with the electric conductive particles having a higher ductility such as gold or silver. On the other hand, a higher pressure is required for the electric conductive powders hardly deformed such as copper or its alloys.

The following description will be directed to preferred embodiments.

EXAMPLE 1

A copper plate having a thickness of 0.5 mm is previously degreased and etched lightly with an aqueous solution of sulfuric acid and hydrogen peroxide. After water washing, the copper plate is electrically plated with silver film by a conventional electric plating method. The plating solution comprises a non-cyanide type commercially available; the used anode is a silver plate; and the current density is 0.5 A/dm$^2$. The resultant silver plating film has a thickness of 500 angstroms and is colored silver white at the copper surface.

Two copper plates having silver plating film formed thereon are washed with water, dried and then overlapped to each other. The overlapped copper plates are interposed between steel plates having a hard chromium plating film formed thereon and then pressed in the following condition; the pressing process can be executed at 180° C. for 30 minutes at a pressure of 300 kg/cm$^2$. As a result, the two plates are strongly adhered to each other. The silver plating film on the copper plate where it is not overlapped is exposed to air during the pressing work and then is colored due to the oxidation of the copper. The joining strength between the two copper plates shows 400 to 500 kg/cm$^2$ in accordance with the shearing peeling strength measurement of the tensile strength test machine.

For the comparison, the following experiment has been carried out: two copper plates are etched lightly, washed with water, dried and then overlapped to each other. The overlapped copper plates are pressed in a similar condition as above but are not bonded to each other. The copper plate having silver plating film formed thereon is overlapped with the copper plate washed with water without silver plating. The overlapped two copper plates are pressed in a similar condition to that mentioned above and are not bonded to each other.

The above experiments indicate clearly that the two copper plates are bonded strongly when two copper plates are electrically plated with silver and pressed to each other at a heated condition.

EXAMPLE 2

A copper foil of 18 μm in thickness is plated at a flat plane with silver film of 100 angstrom is a similar way to that of Example 1. The copper foil in overlapped on the copper plate having a silver plating film formed thereon obtained in Example 1 and then pressed in a similar condition of those of Example 1 except for the pressure of 750 kg/cm$^2$. For the easy pressing work, the another side plane of the copper foil is overlapped with a copper plate of 1 mm in thickness. The copper foil is joined to the copper plate having silver plating film formed thereon but is not joined to the copper plate by a pressing work.

The pressing work permits the copper foil to join strongly to the copper plate. The peeling test causes the copper foil to be broken and then it is not possible to obtain correctly the joining strength.

EXAMPLE 3

In order to know the effect of the contamination of the surface, the surface of the copper plate having a silver plating film formed thereon is coated with an epoxy resin (the epoxy resin comprises epichlorohydrin—bisphonol type of epoxy equivalent of 180) including no curing agent and pressed in a condition similar to that of Example 1. The result shows a joining strength the same as that of Example 1. It is concluded that even if the surface of the copper plate having a silver plating film formed thereon is contaminated with resin, there is no effect on the peeling strength of the resultant bonding.

EXAMPLE 4

A silver plate of 0.5 mm thickness is overlapped with a copper plate having silver plating film formed thereon and then pressed in a condition the same as that of Example 1. This case shows a strong joint the same as that of Example 1. It is found at the XMA analysis, as shown in FIG. 5 that the copper atoms diffuse to a surface of the silver plate in the depth of a few microns. This result clearly shows the bonding mechanism of the present invention.

EXAMPLE 5

The same combination as that of Example 1 is pressed at 170° C. for one hour instead of 180° C. and 30 min. used in Example 1. The two copper plates join to each other but the strength is very poor. A slight mechanical shaking separates the two copper plates.

EXAMPLE 6

The two copper plates are plated with plating silver film of thickness 100 angstroms different from that of the Example 1. Then, the two copper plates are treated in a similar manner to that of Example 1. It is possible to obtain the joining strength the same as that of Example 1. This indicates that even the thin film of plated silver results in giving a sufficiently strong joining strength therebetween.

EXAMPLE 7

A phosphor bronze plate of 0.2 mm thick is electrically plated with silver in a similar way to that of Example 1. The plated silver film has a thickness of 500 angstrom. The two phosphor bronze plates having silver film plated thereon are overlapped to each other and pressed at 180° C., for 30 min. at a pressure of 2000 kg/cm$^2$. The two phosphor bronze plates are joined to each other. However, the strength is so weak that the two phosphor bronze plates are easily separated from each other upon bending at the joint portion. When the pressing is carried out at 220° C., it is possible to obtain a strong joint without the loss of the elasticity of phosphor bronze.

EXAMPLE 8

A copper foil on the printed circuit board is plated with gold. The plated gold film has a thickness of 200 angstrom. After removing the solder plating layer of the IC lead wire of QFP package by etching the lead wire is plated with copper and further with silver. The plated copper film has a thickness of 5 μm and the plated silver film has a thickness of 500 angstrom. After the IC lead wire is position at a given positioned of the printed circuit board, the printed circuit board is heated at 220° C. for one minutes under the lead wire being compressed by a pressing jig. As a result, the lead wire can be strongly joined to the circuit wiring board.

A heating and cooling cycle test is carried out with the circuit obtained by the present invention and the circuit obtained by the conventional-soldering method. The test result shows that the circuit obtained by the present invention shows a durability longer 2 times than that of the circuit obtained by the conventional soldering method. Further, the circuit obtained by the conventional soldering method is broken upon being heated at 200° C. while the circuit obtained by the present invention does not show any change upon being heated at 200° C.

EXAMPLE 9

A copper plate of 2 mm thickness is ground at the surface with a sand paper of #1200, washed with water and dried. After that, the copper plate is coated with 5% of abietic acid acetone solution and is dried to the treated copper plate. The two treated copper plates are overlapped to each other and are pressed at 380 kg/cm$^2$, for 30 minutes at 180° C. to be joined together. A test piece is prepared from the joined copper plates and is tested with a shear extension apparatus. The joined copper plates show a shear extension strength of 240 to 260 kg/cm$^2$ and are joined to each other strongly.

For a comparison, the copper plates mentioned above are ground with a sand paper of #1200, washed with water and dried. The two copper plates are overlapped to each other and are pressed in a similar condition to that of the above procedure. The result shows no joint between the two copper plates.

It is confirmed that when the copper plates are coated with 5% of abietic acid acetone solution and pressed at a heated condition in accordance with the present invention, the two copper plates can be joined together strongly.

EXAMPLE 10

The treated copper plate of Example 9 is overlapped with a silver plate of 2 mm thickness. The overlapped copper plate with silver plate is pressed in a condition similar to that of Example 9. Both plates are joined strongly to each other. The extension test shows that the joined plate of copper plate and silver plate has a shear extension strength of 540 to 600 kg/cm$^2$.

Figure 6:
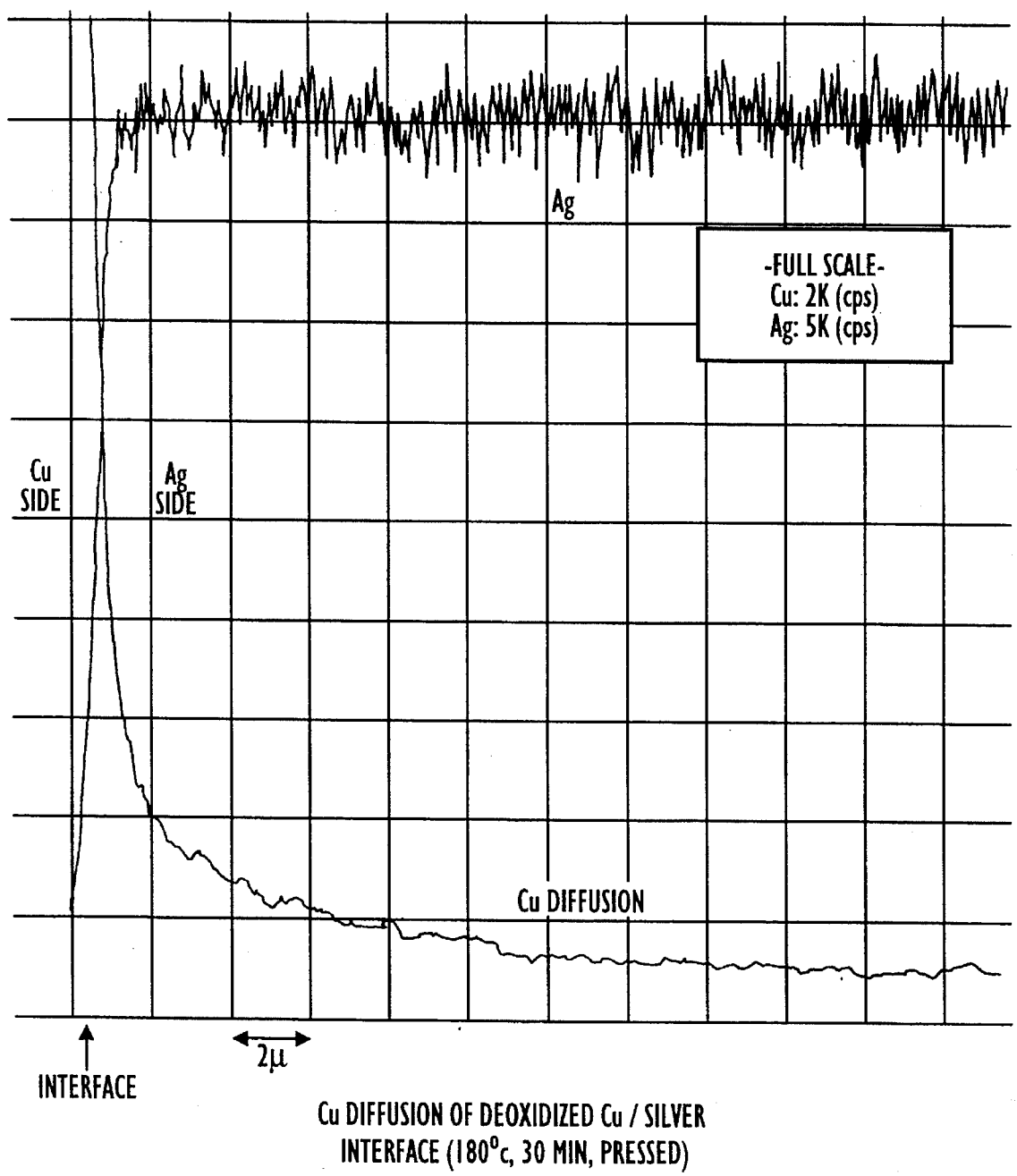
FIG. 6 is a graph of Cu diffusion of deoxidized Cu/Silver interface (180° C., 30 min, Pressed) at XMA analysis in Example 10.
Figure 7:
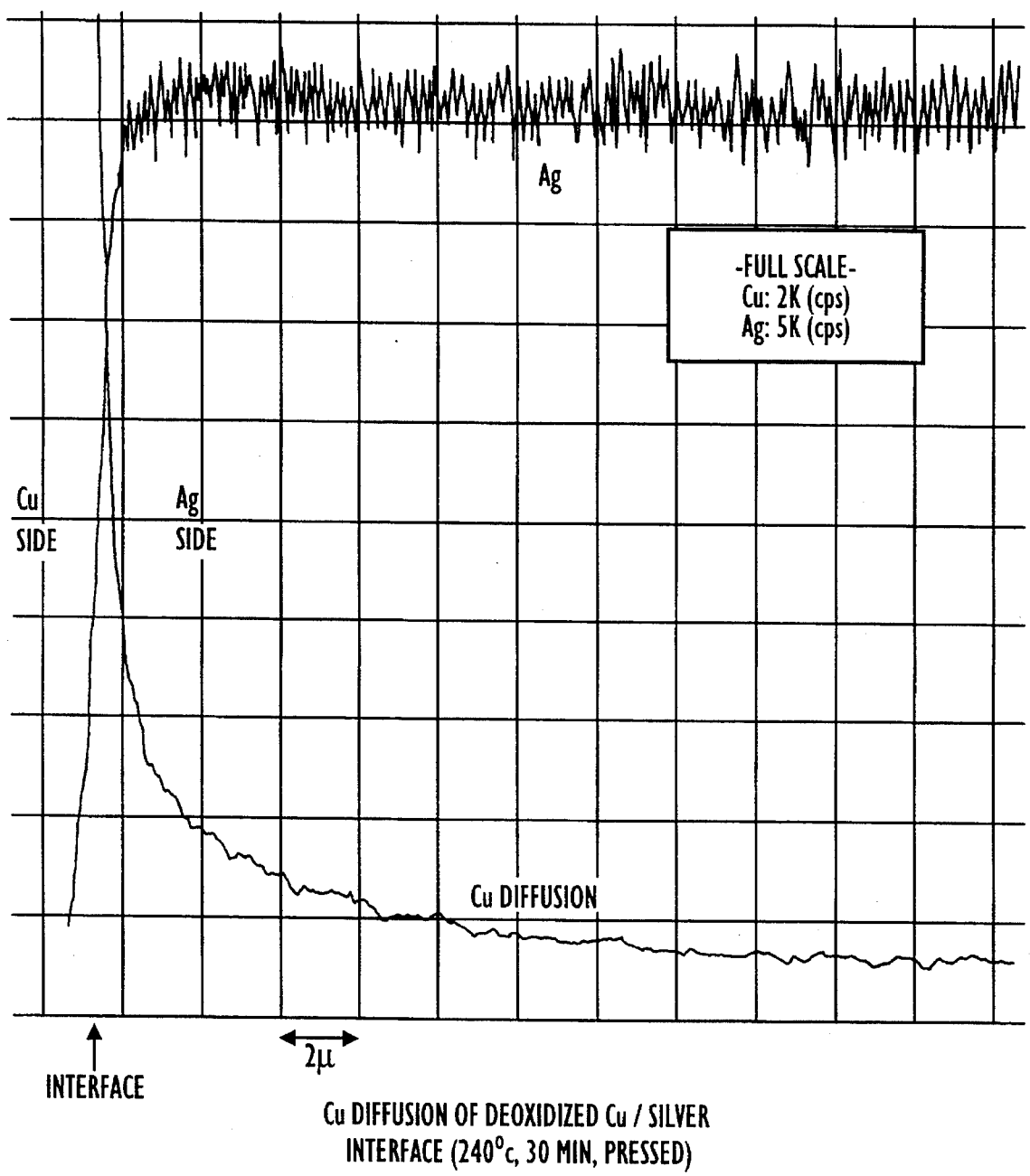
FIG. 7 is a graph of Cu diffusion of deoxidized Cu/Silver interface (240° C., 30 min, Pressed) at XMA analysis in Example 10.

The observation by an XMA analyzer indicates that silver and copper diffuse by several microns to the copper layer and to the silver layer, respectively at the boundary of the joined portion as shown in FIG. 6. The results of an XMA analysis of 240° C., 30 min. pressed copper/silver interface is also shown in FIG. 7.

EXAMPLE 11

A copper round bar having a diameter of 5 mm is ground at the heading and is coated with abietic acid solution at the flat plane of the heading. Then, after drying, the copper round bar butts at the flat plane against a silver disc having a thickness of 0.5 mm and a diameter of 5 mm. A combination of the copper bar butting against the silver disc is pressed by a pressure of 680 kg/cm$^2$ for 30 minutes at 195° C. The resultant copper round bar is tested with a tensile strength test. The testing result shows that the copper round bar butting against the silver disc has a beak down strength of 830 kg/cm$^2$. It is verified that the copper round bar is strongly joined to the silver disc in accordance with the present invention.

EXAMPLE 12

After phosphor bronze plate is coated with abietic acid, gold wire having a diameter of 1 mm is placed on the phosphor bronze plate. The combination of phosphor bronze plate and gold wire is pressed at 195° C. for 15 minutes. As a result, the gold wire joins to the phosphor bronze plate. The peeling test of the gold wire indicates a peeling strength of 4.0 kg/mm$^2$. It is found that the gold wire joins strongly to the phosphor bronze plate in accordance with the present invention.

EXAMPLE 13

This Example uses N-laurel aspartic acid β-laurel ester as a copper oxide remover instead of abietic acid used in Example 9. In this case, the remover is scattered on the heated copper plate and is melted. The two copper plates are joined to each other using the melted remover. It is possible to obtain the joining strength similar to that of Example 9.

EXAMPLE 14

A polymer is prepared by stirring and heating a mixture of acrylic acid monomer and 0.5% of benzoyl peroxide at 60° C. A 5% aqueous solution of the resulting polymer is used as an oxidized layer remover instead of abietic acid used in Example 9. In this case, it is possible to obtain the strong diffusion joint in a similar way to that of Example 9.

EXAMPLE 15

The combination the same as that of Example 9 is pressed at 170° C. for one hour instead of 180° C. and 30 min. of Example 1. The two copper plates join to each other but the strength is very poor. A slight mechanical shock separates the two copper plates.

EXAMPLE 16

An electric conductive paste is prepared by dispersing 75 g copper particles of a spherical form having a diameter 4 to 5 μm (Tanaka kikinzoku Co. CRYSTAL COPPER) in a solution of 35 g cellsolve acetate and 25 g rosin. This electric conductive paste is imprinted at a through hole of a diameter 0.5 mm formed at a given position of a glass-epoxy prepreg. The glass-epoxy prepreg is interposed between two copper foils having a thickness of 35 μm and then is pressed into a double layered printed circuit board of a thickness of 0.5 mm. The pressing is carried out at a pressure of 150 kg/cm$^2$ at 180° C. for 30 minutes.

The board is etched for the purpose of formation of a given pattern. Then, the through hole is measured with a direct current resistance. The testing result indicates that one through hole has an electric resistance less than one m Ω. This electric resistance is kept at a current range from a high current to 10 μA.

For comparison, the conventional silver through hole circuit board has a through hole resistance of 10 m Ω which increases when the electric current is less than 10 mA.

EXAMPLE 17

An electric conductive paste is prepared by dispersing 75 g of spray type copper particles having a diameter 2 to 15 μm in a solution containing 7.5 g of dimethylor propionic acid and 15 g of an epoxy resin (epoxy equivalent 180) comprising epichlorohydrin bisphenol A type. This electric conductive paste is imprinted in a through hole of a diameter 0.5 mm formed at a given position of a glass-epoxy prepreg. The glass-epoxy plate is interposed between two copper foils having a thickness of 35 μm and then is pressed to give a double layered printed wiring board of a thickness of 0.5 mm. The pressing is carried out at a pressure of 150 Kg/cm$^2$ at 180° C. for 30 minutes.

The board is etched for purpose of formation of a given patter. Then, the through hole is measured with a direct current resistance. The testing result indicates that one through hole has an electric resistance less than one m Ω. This electric resistance is kept at a current range from a high current to 10 μA.

The circuit substrate is subjected to a heat cycle test from 260° C. to 25° C. The test result indicates that the electric resistance does not change up to 300 cycles test.

For comparison, the conventional silver through hole circuit board has a through hole resistance of 10 m Ω which increases when the electric current is less than 10 mA. The heat cycle test indicates that the conventional silver through hole circuit board changes in the electric resistance more than 20% through 100 cycles.

This testing result clearly indicates that the double layered printed circuit board of this embodiment has copper foils at top and bottom planes joined electrically completely to each other.

EXAMPLE 18

An epoxy prepreg is drilled to make holes of 0.5 mm. The electric conductive paste prepared in Example 17 is applied to an epoxy prepreg. The epoxy prepreg is interposed between the two of the double layered printed wiring boards obtained by Example 17 and is pressed at a heated condition in order to form a four layer printed wiring board. The resultant four layer printed wiring board has an electric connection among four layers, which is characterized by a stable and a low electric resistance in a similar way to that of Example 17. It is verified that a simple process of hot pressing shown in this embodiment makes it possible to manufacture a multilayer printed wiring board having superior characteristic in the electrical connection.

EXAMPLE 19

An electric conductive paste is prepared by dispersing 75 g of a spray type copper powder having a diameter 2 to 15 μm in a solution of 25 g cellsolve acetate and 25 g rosin. This electronic conductive paste is imprinted in a through hole of a diameter 0.5 mm formed at a given position of a glass-epoxy prepreg. The glass epoxy plate is interposed between two copper foils having a thickness of 35 μm and then is pressed into a double layered printed circuits board of a thickness of 0.5 mm. The pressing is carried out at a pressure of 150 Kg/cm$^2$ at 180° C. for 30 minutes.

The board is etched for the purpose of formation of a given pattern. Then, the through hole is measured with a direct current resistance. The testing result indicates that one through hole has an electric resistance less than 0.1 m Ω. This electric resistance is kept at a current range from a high current to 10 μA.

EXAMPLE 20

An electric conductive paste is prepared by using silver particles of spherical form having a diameter of 1 μm in replacement of copper particles used in Example 17. The double layered circuit board is prepared by using the electrical conductive paste mentioned above. A hot pressing in this embodiment is carried out at a pressure of 50 Kg/cm$^2$ at 190° C. This embodiment also can produce a double layered circuit board superior in the reliability and the electric conductivity. A microscopic observation at the through hole area of the double layered circuit board of this embodiment indicates that the silver particles are formed into one body of silver pillar and that silver and copper execute a mutual diffusion at the boundary of the copper foil and the, silver pillar.

EXAMPLE 21

In place of a solution of dimethylol propionic acid and an epoxy resin (epoxy equivalent 180) comprising epichlorohydrin-bisphenol A type used in Example 17, this embodiment uses styrene-maleic acid (1:1) copolymer. In this case, methylethylketone is used for a solvent of the electric conductive paste. This embodiment can produce a double layered circuit board superior in the electric connection in accordance with the present invention.

EXAMPLE 22

In place of a solution of dimethylol propionic acid used in Example 17, this embodiment uses N-stearoil aspartic acid mono-stearyl ester and achieves a double layered circuit board superior in the electric connection between the circuits on both sides.

EXAMPLE 23

The pressing temperature in Example 17 is changed to 170° C. The pressing time in Example is changed to one hour. The double layered circuit board obtained in such a condition has an electric conduction between both sides similar to that of Example 17 but shows a break down at 20 cycles of heat cycle test. These data show that the allowable pressing temperature is 170° C. as a lowest limit.

As described in these embodiments, the method for manufacturing the multilayer printed wiring board according to the present invention is simple in a similar way to that of the silver through hole method, but achieves the multi-layer circuit board superior in the electrical conductivity across both sides similar to that of an electroplating method.

What is claimed is:

1. A method for preparing a multilayer printed wiring board which comprises:

providing at least two foils of Cu or Cu alloy; interposing an insulating adhesive layer between each pair of adjacent foils; making via holes in the each insulating adhesive layer at desired positions; imprinting the via holes with a conductive paste and heatpressing them to electrically connect the foils through the via holes imprinted with the conductive paste, wherein the conductive paste mainly consists of conductive metal particles selected from the group comprising Ag, Cu and alloys thereof and a metal oxide remover; wherein the heat pressing is carried out at a temperature higher than about 170° C. whereat the Cu atoms can be diffused.

2. The method for preparing a multilayer printed wiring board according to claim 1, wherein the metal oxide remover is selected from the group comprising carboxylic acids and polymers of oligomers having carboxyl groups.

3. The method for preparing a multilayer printed wiring board according to claim 2, wherein the metal oxide remover acts as the binding resin.

4. The method for preparing a multilayer printed wiring board according to claim 1, wherein the conductive metal particles are of spherical form.

5. The method for preparing a multilayer printed wiring board according to claim 1, wherein the step of imprinting the via holes with a conductive paste comprises a step of drilling the insulating adhesive layer sandwiched between a pair of peelable films; a step of imprinting the conductive paste on the peelable film; and a step of peeling the peelable films.

* * * * *